(12) United States Patent
Bai et al.

(10) Patent No.: US 7,390,746 B2
(45) Date of Patent: Jun. 24, 2008

(54) MULTIPLE DEPOSITION FOR INTEGRATION OF SPACERS IN PITCH MULTIPLICATION PROCESS

(75) Inventors: Jingyi Bai, San Jose, CA (US); Gurtej S. Sandhu, Boise, ID (US); Shuang Meng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 11/213,486

(22) Filed: Aug. 25, 2005

(65) Prior Publication Data

US 2007/0049040 A1    Mar. 1, 2007

Related U.S. Application Data

(60) Provisional application No. 60/662,323, filed on Mar. 15, 2005.

(51) Int. Cl.
*H01L 21/302* (2006.01)
(52) U.S. Cl. .................. 438/689; 438/710; 438/706; 438/761; 438/778; 438/283; 438/275
(58) Field of Classification Search .................. 438/689
See application file for complete search history.

(56) References Cited

U.S. PATENT DOCUMENTS

| | | |
|---|---|---|
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |

(Continued)

FOREIGN PATENT DOCUMENTS

| | | |
|---|---|---|
| DE | 280851 | 7/1990 |
| DE | 42 36 609 A1 | 5/1994 |
| EP | 0227303 | 7/1987 |
| EP | 0491408 | 6/1992 |
| EP | 1357433 | 10/2003 |

(Continued)

OTHER PUBLICATIONS

B. Lim, Nature vol. 2, Nov. (2003) pp. 749-753.*

(Continued)

*Primary Examiner*—Nadine Norton
*Assistant Examiner*—Maki Angadi
(74) *Attorney, Agent, or Firm*—Knobbe Martens Olson & Bear LLP

(57) ABSTRACT

Pitch multiplication is performed using a two step process to deposit spacer material on mandrels. The precursors of the first step react minimally with the mandrels, forming a barrier layer against chemical reactions for the deposition process of the second step, which uses precursors more reactive with the mandrels. Where the mandrels are formed of amorphous carbon and the spacer material is silicon oxide, the silicon oxide is first deposited by a plasma enhanced deposition process and then by a thermal chemical vapor deposition process. Oxygen gas and plasma-enhanced tetraethylorthosilicate (TEOS) are used as reactants in the plasma enhanced process, while ozone and TEOS are used as reactants in the thermal chemical vapor deposition process. The oxygen gas is less reactive with the amorphous carbon than ozone, thereby minimizing deformation of the mandrels caused by oxidation of the amorphous carbon.

55 Claims, 24 Drawing Sheets

U.S. PATENT DOCUMENTS

| | | | |
|---|---|---|---|
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,514,885 A | 5/1996 | Myrick | |
| 5,670,794 A | 9/1997 | Manning | |
| 5,753,546 A | 5/1998 | Koh et al. | |
| 5,795,830 A | 8/1998 | Cronin et al. | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,057,573 A | 5/2000 | Kirsch et al. | |
| 6,063,688 A | 5/2000 | Doyle et al. | |
| 6,071,789 A | 6/2000 | Yang et al. | |
| 6,211,044 B1 | 4/2001 | Xiang et al. | |
| 6,288,454 B1 | 9/2001 | Allman et al. | |
| 6,291,334 B1 | 9/2001 | Somekh | |
| 6,297,554 B1 | 10/2001 | Lin | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |
| 6,455,372 B1 | 9/2002 | Weimer | |
| 6,475,867 B1 | 11/2002 | Hui et al. | |
| 6,514,884 B2 * | 2/2003 | Maeda | 438/787 |
| 6,522,584 B1 | 2/2003 | Chen et al. | |
| 6,534,243 B1 | 3/2003 | Templeton | |
| 6,548,396 B2 | 4/2003 | Naik et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,667,237 B1 | 12/2003 | Metzler | |
| 6,673,684 B1 | 1/2004 | Huang et al. | |
| 6,686,245 B1 * | 2/2004 | Mathew et al. | 438/283 |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,773,998 B1 | 8/2004 | Fisher et al. | |
| 6,794,699 B2 | 9/2004 | Bissey et al. | |
| 6,800,930 B2 | 10/2004 | Jackson et al. | |
| 6,867,116 B1 | 3/2005 | Chung | |
| 6,875,703 B1 | 4/2005 | Furukawa et al. | |
| 6,893,972 B2 | 5/2005 | Rottstegge et al. | |
| 6,962,867 B2 | 11/2005 | Jackson et al. | |
| 7,084,076 B2 | 8/2006 | Park et al. | |
| 2001/0005631 A1 | 6/2001 | Kim et al. | |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0127810 A1 | 9/2002 | Nakamura et al. | |
| 2003/0006410 A1 | 1/2003 | Doyle | |
| 2003/0044722 A1 | 3/2003 | Hsu et al. | |
| 2003/0119307 A1 | 6/2003 | Bekiaris et al. | |
| 2003/0127426 A1 | 7/2003 | Chang et al. | |
| 2003/0157436 A1 | 8/2003 | Manger et al. | |
| 2003/0207207 A1 | 11/2003 | Li | |
| 2003/0207584 A1 | 11/2003 | Sivakumar et al. | |
| 2003/0230234 A1 | 12/2003 | Nam et al. | |
| 2004/0000534 A1 | 1/2004 | Lipinski | |
| 2004/0018738 A1 | 1/2004 | Liu | |
| 2004/0023475 A1 | 2/2004 | Bonser et al. | |
| 2004/0023502 A1 | 2/2004 | Tzou et al. | |
| 2004/0041189 A1 | 3/2004 | Voshell et al. | |
| 2004/0043623 A1 | 3/2004 | Liu et al. | |
| 2004/0053475 A1 | 3/2004 | Sharma | |
| 2004/0079988 A1 | 4/2004 | Harari | |
| 2004/0106257 A1 | 6/2004 | Okamura et al. | |
| 2004/0235255 A1 | 11/2004 | Tanaka et al. | |
| 2004/2035255 | 11/2004 | Tanaka | |
| 2005/0074949 A1 | 4/2005 | Jung et al. | |
| 2005/0164454 A1 | 7/2005 | Leslie | |
| 2005/0186705 A1 | 8/2005 | Jackson et al. | |
| 2005/0272259 A1 | 12/2005 | Hong | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1 * | 3/2006 | Abatchev et al. | 438/689 |
| 2006/0083996 A1 | 4/2006 | Kim | |
| 2006/0172540 A1 | 8/2006 | Marks et al. | |
| 2006/0211260 A1 | 9/2006 | Tran et al. | |
| 2006/0216923 A1 | 9/2006 | Tran et al. | |
| 2006/0231900 A1 | 10/2006 | Lee et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |

FOREIGN PATENT DOCUMENTS

| | | |
|---|---|---|
| JP | 05343370 | 12/1993 |
| JP | H8-55908 | 2/1996 |
| JP | H8-55920 | 2/1996 |
| WO | WO 02/099864 A1 | 12/2002 |
| WO | WO 2004/001799 A2 | 12/2003 |
| WO | WO 2004/003977 A2 | 1/2004 |
| WO | WO 2005/010973 | 2/2005 |
| WO | WO 2006-026699 | 3/2006 |

OTHER PUBLICATIONS

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515, filed Oct. 24, 2006, MICRON Ref. No. 2005-1173.00/US".

Ex Parte Cantell, unpublished decision of the Board of Patent Appeals and Interferences, Mar. 4, 2005.

Choi et al., "Sublithographic nanofabrication technology for nanocatalysts and DNA chips," J. Vac. Sci. Technol., pp. 2951-2955 (Nov./Dec. 2003).

* cited by examiner

MULTIPLE DEPOSITION FOR INTEGRATION OF SPACERS IN PITCH MULTIPLICATION PROCESS

REFERENCE TO RELATED APPLICATIONS

This application is related to the following: U.S. patent application Ser. No. 10/934,778 to Abatchev et al., filed Sep. 2, 2004; and U.S. Patent Provisional Application No. 60/662,323 to Tran et al., filed Mar. 15, 2005, entitled Pitch Reduced Patterns Relative To Photolithography Features.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Storage capacities and speeds can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a resolution limit that results in a minimum pitch below which a particular photolithographic technique cannot reliably form features. Thus, the minimum pitch of a photolithographic technique is an obstacle to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

As can be seen in FIGS. 1E and 1F, the separation between the spacers 60 is partly dependent upon the width of the mandrels 40. As a result, any deformation of the mandrels 40 can change the desired position of the spacers 60. For example, the mandrels 40 can be deformed during processing steps that occur after they are formed.

Accordingly, there is a need for methods of ensuring the physical integrity of the mandrels used in pitch multiplication.

SUMMARY OF THE INVENTION

According to one aspect of the invention, a process is provided for semiconductor processing. The process comprises providing a plurality of mandrels over a substrate in a reaction chamber. A first layer of spacer material is deposited on the mandrels using a first set of reactive species. A second layer of spacer material is then deposited over the mandrels using a second set of reactive species. The first and second layers of spacer material are etched to form spacers.

According to another aspect of the invention, a method is provided for semiconductor processing. The method comprises defining a pattern in a photoresist layer over a substrate. The pattern is transferred from the photoresist layer to an underlying layer of temporary material. Transferring the pattern from the photoresist layer forms a plurality of temporary placeholders in the layer of temporary material. A first layer of spacer material is deposited on the plurality of features by a first deposition process. A second layer of spacer material is then deposited on the first layer by a second deposition process. Spacer material of the first and second layers are removed from horizontal surfaces to form a plurality of vertically extending silicon oxide features on sidewalls of the temporary placeholders. The plurality of vertically extending silicon oxide features comprise spacer material of the first and second layers. The temporary placeholders are removed. The substrate is processed through a mask pattern defined by the plurality of vertically extending silicon oxide features.

According to yet another aspect of the invention, a method is provided for semiconductor processing. The method comprises providing a plurality of mandrels over a substrate. A chemical reaction barrier is formed on the mandrels. A layer of spacer material is formed on the chemical reaction barrier. The mandrel is preferentially removed relative to the spacer material.

According to yet another aspect of the invention, a method is provided for forming an integrated circuit. The method comprises forming a mandrel over a substrate. A first spacer layer is deposited over the mandrel by a first deposition process. A second spacer layer, which is more conformal than the first layer, is deposited on the first spacer layer and over the mandrel by a second deposition process. The mandrels are subsequently removed.

According to yet another aspect of the invention, a process is provided for forming an integrated circuit. The process comprises depositing a first layer of spacer material over a mandrel. A second layer of spacer material is subsequently deposited over the mandrel. The mandrel is selectively removed relative to the spacer material of the first and second layers. The first layer is denser than the second layer.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
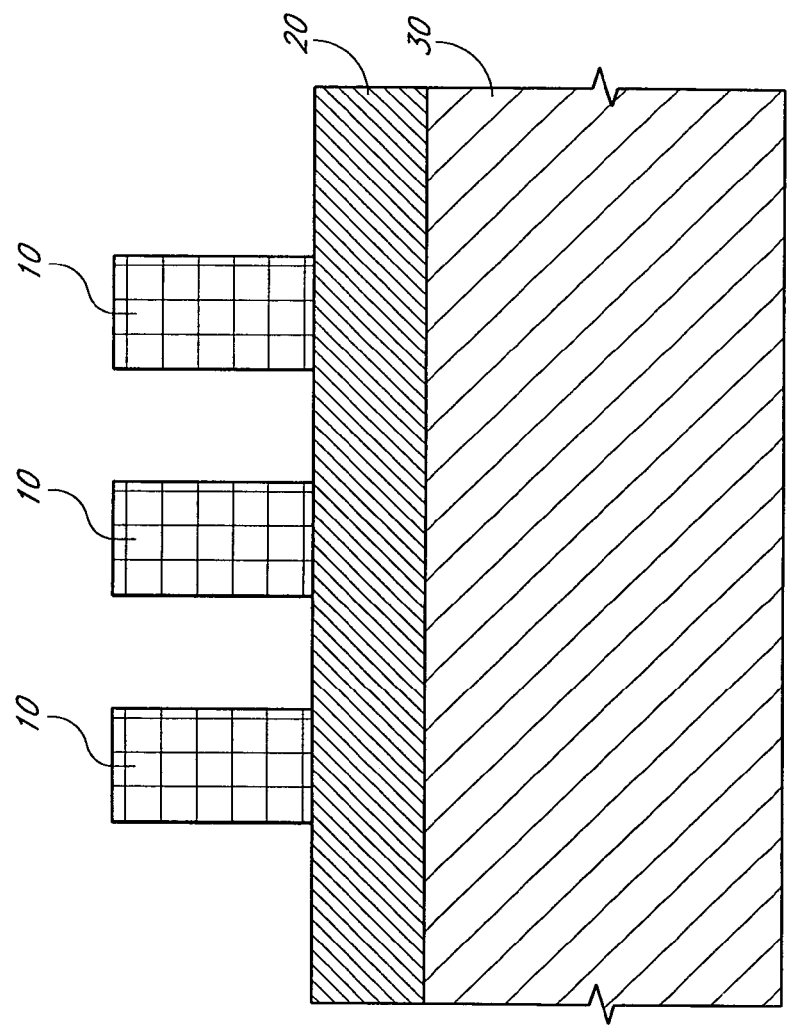
FIGS. 1A-1F are schematic, cross-sectional side views of a sequence of masking patterns for forming conductive lines, in accordance with a prior art pitch doubling method.
Figure 1B:
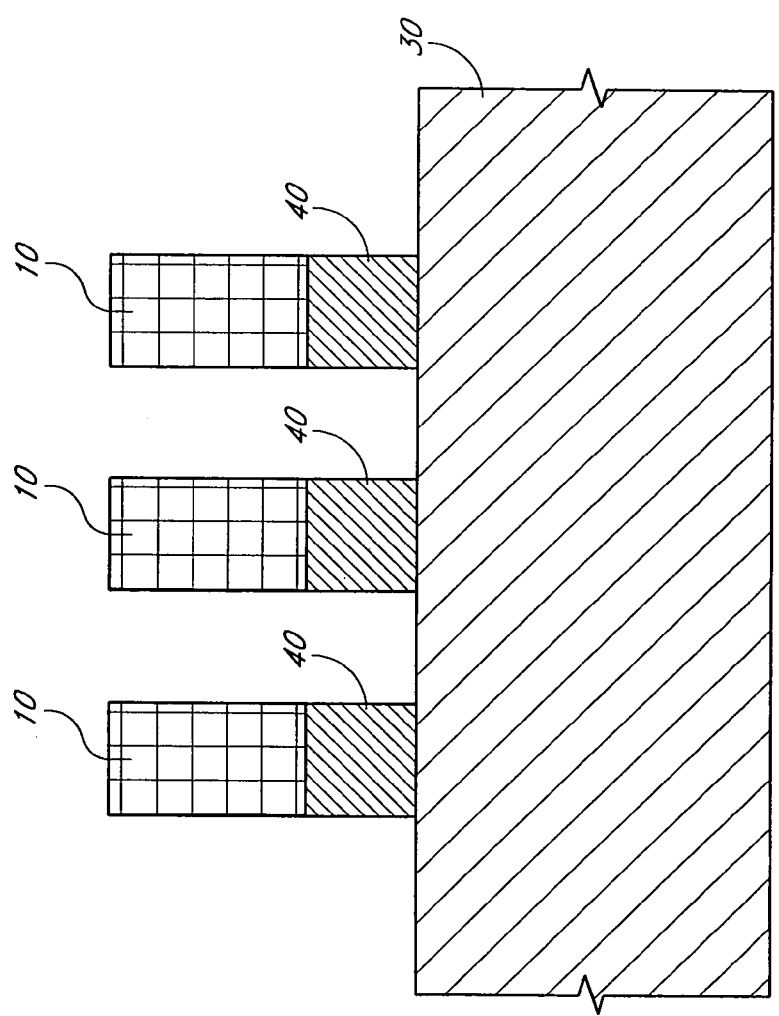
Figure 1C:
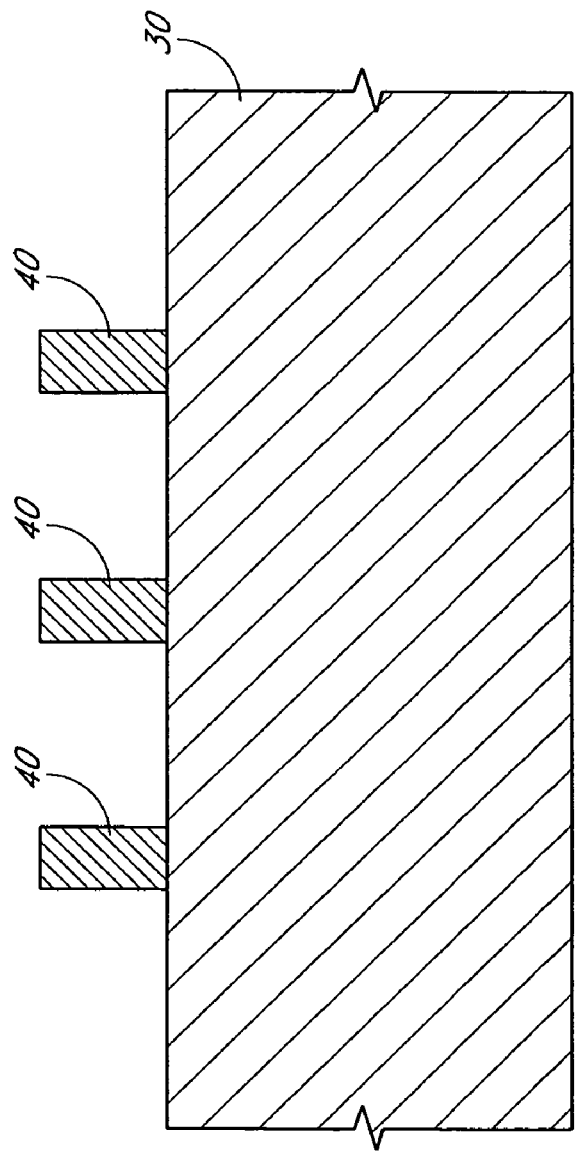
Figure 1D:
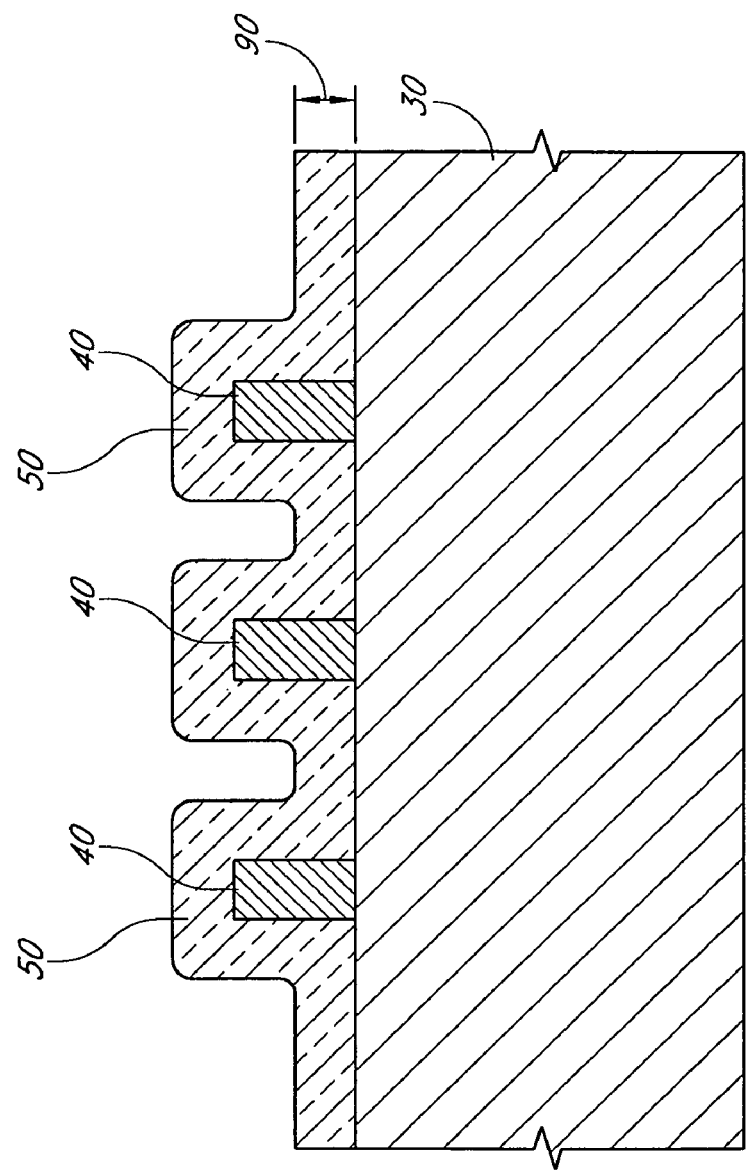
Figure 1E:
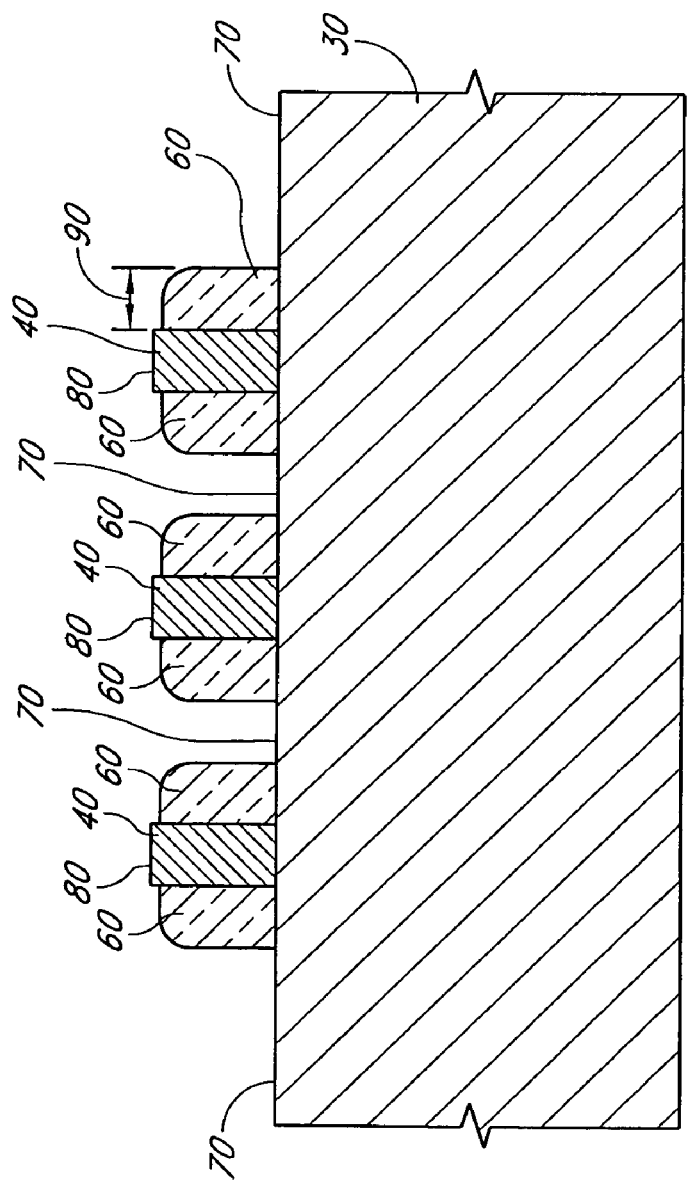
Figure 1F:
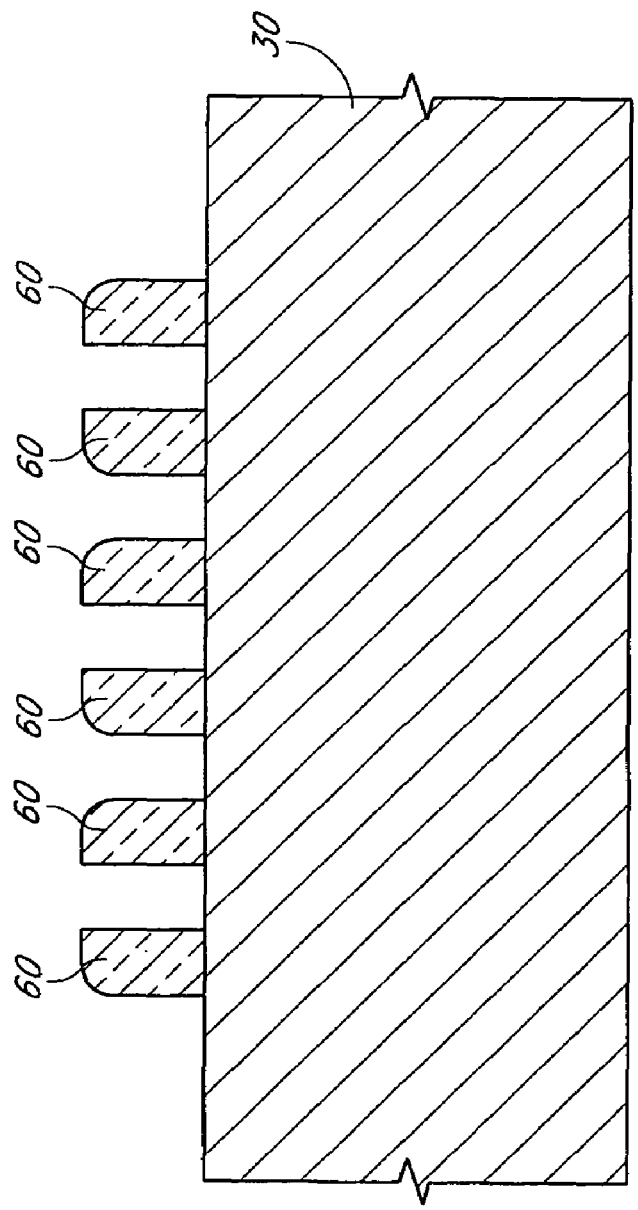
Figure 2A:
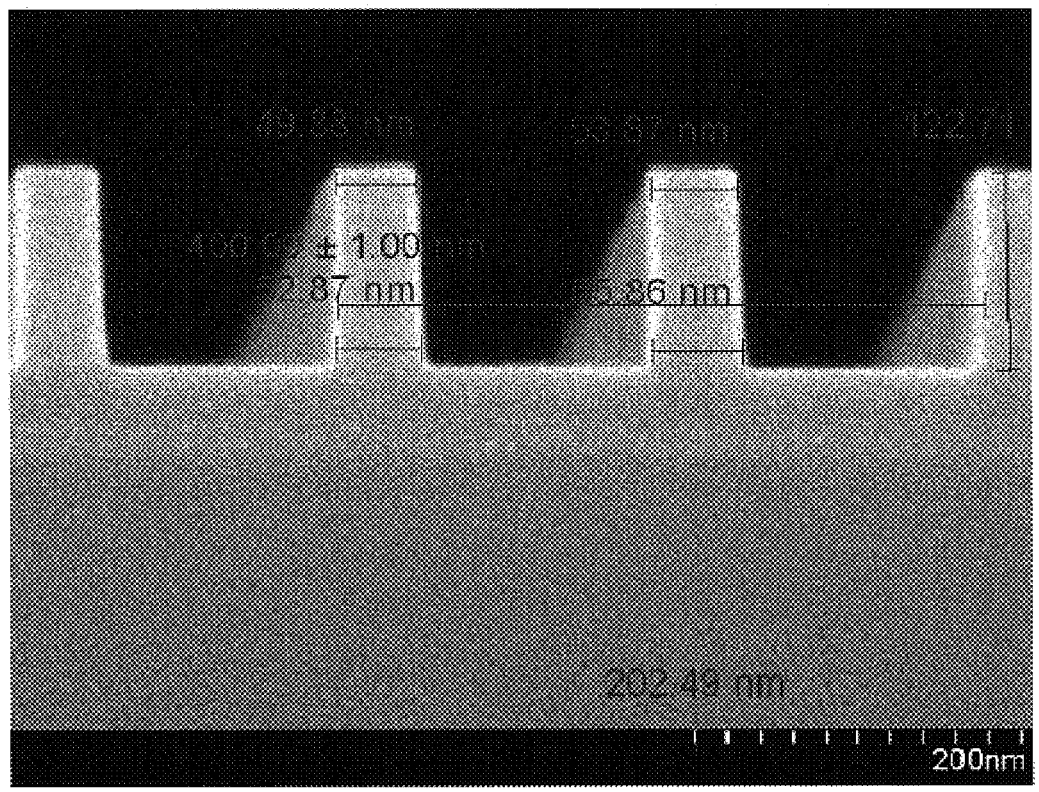
FIG. 2A is a micrograph, as viewed through a scanning electron microscope, of a perspective side view of a partially formed integrated circuit with mandrels, in accordance with preferred embodiments of the invention.
Figure 2B:
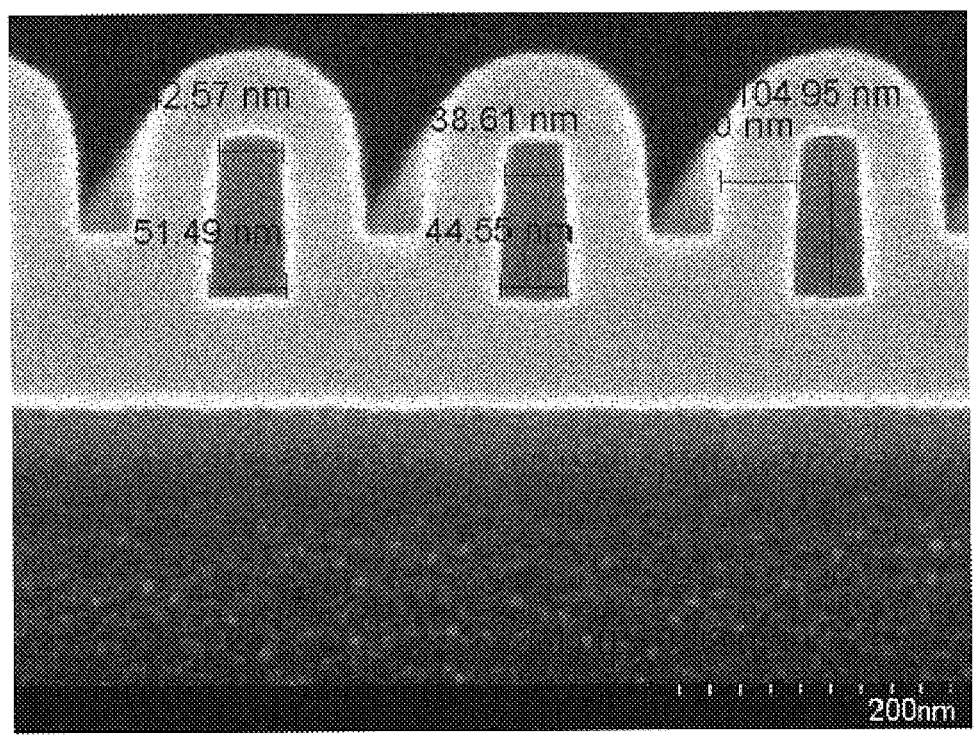
FIG. 2B is a micrograph, as viewed through a scanning electron microscope, of a perspective side view of the partially formed integrated circuit of FIG. 2A after depositing spacer material using reactants highly reactive with the mandrels.

It has been found that mandrels can be deformed during the deposition of spacer material. FIG. 2A shows mandrels before depositing spacer material. Where the mandrels are formed of amorphous carbon, silicon oxide can be used as a spacer material, among other materials possibilities. The spacer material is preferably deposited using a process that deposits highly conformal layers, e.g., processes such as thermal chemical vapor deposition of silicon oxide using $O_3$ and TEOS. $O_3$, however, is a strong oxidizer and has been found to shrink and otherwise deform the amorphous carbon mandrels, as shown in FIG. 2B. Consequently, spacers formed on the deformed mandrels may no longer be at their expected and desired positions and/or spacings from one another. As a result, the predictability and uniformity of spacer location and spacing can be adversely affected by mandrel deformation.

In preferred embodiments of the invention, in a process for minimizing mandrel deformation, a layer of material is deposited as a reaction barrier layer, i.e., a layer that prevents or reduces reactions between the mandrels and chemical species from a subsequent deposition of spacer material, including reactants and by-products of the subsequent deposition or chemical species deposited by the subsequent deposition. The material forming the reaction barrier layer can be different from the spacer material, but preferably is the same material as the spacer material. The reaction barrier layer is preferably deposited using a process and/or reactants having relatively less reactivity with the mandrels than the process and/or reactants used in the subsequent spacer material deposition. In addition, the reaction barrier layer is preferably deposited to a thickness sufficiently thick to act as a diffusion barrier that prevents reactants in the subsequent spacer material deposition from reacting with the mandrels under conditions prevalent during the second deposition. Optionally, multiple layers of material, which may the same or different materials, may be deposited to form the reaction barrier layer.

In accordance some preferred embodiments, the mandrels are formed of amorphous carbon and the spacer material and the material used in the reaction barrier layer is silicon oxide. Thus, the reaction barrier layer constitutes a first layer of spacer material and is formed using a process and reactants having low reactivity with the amorphous carbon. For example, the reaction barrier layer can be formed using $O_2$ and TEOS in a plasma-enhanced chemical vapor deposition (PECVD). While this PECVD process does not result in a film as conformal as, e.g., a film formed using $O_3$ and TEOS, this relative non-conformality can be minimized by depositing a layer only about as thick as necessary to reduce and, preferably, minimize reaction of the mandrels with a chemical species from a subsequent deposition of spacer material.

A second layer of spacer material can be deposited in the subsequent spacer material deposition. This deposition preferably results in a highly conformal layer of spacer material and can be accomplished using a process and reactants having high reactivity with the mandrels. The spacer material can be deposited by, e.g., using non-radical reactants such as $O_3$ and TEOS in a thermal CVD. Because the second layer of spacer material can preferably be deposited more conformally than the first layer, the second layer is preferably thicker than the first layer, so that a majority of the spacer material can be deposited by the more conformal deposition. Thus, a spacer layer that is an aggregate of the first and second layers can be deposited with good conformality by depositing a majority of the spacer layer during the second deposition.

Advantageously, the above-noted reaction of the $O_3$, or ozone, with the mandrels is minimized by the presence of the reaction barrier layer which blocks the mandrels from the $O_3$. Thus, deformation of the mandrels caused by reactions with reactants or deposited chemical species from spacer depositions can be minimized. As a result, spacers can be more reliably formed with desired spacings and positions.

Reference will now be made to the Figures, wherein like numerals refer to like parts throughout. It will be appreciated that the Figures are not necessarily drawn to scale.

Initially, a sequence of layers of materials is formed to allow formation of the spacers over a substrate.

Figure 3:
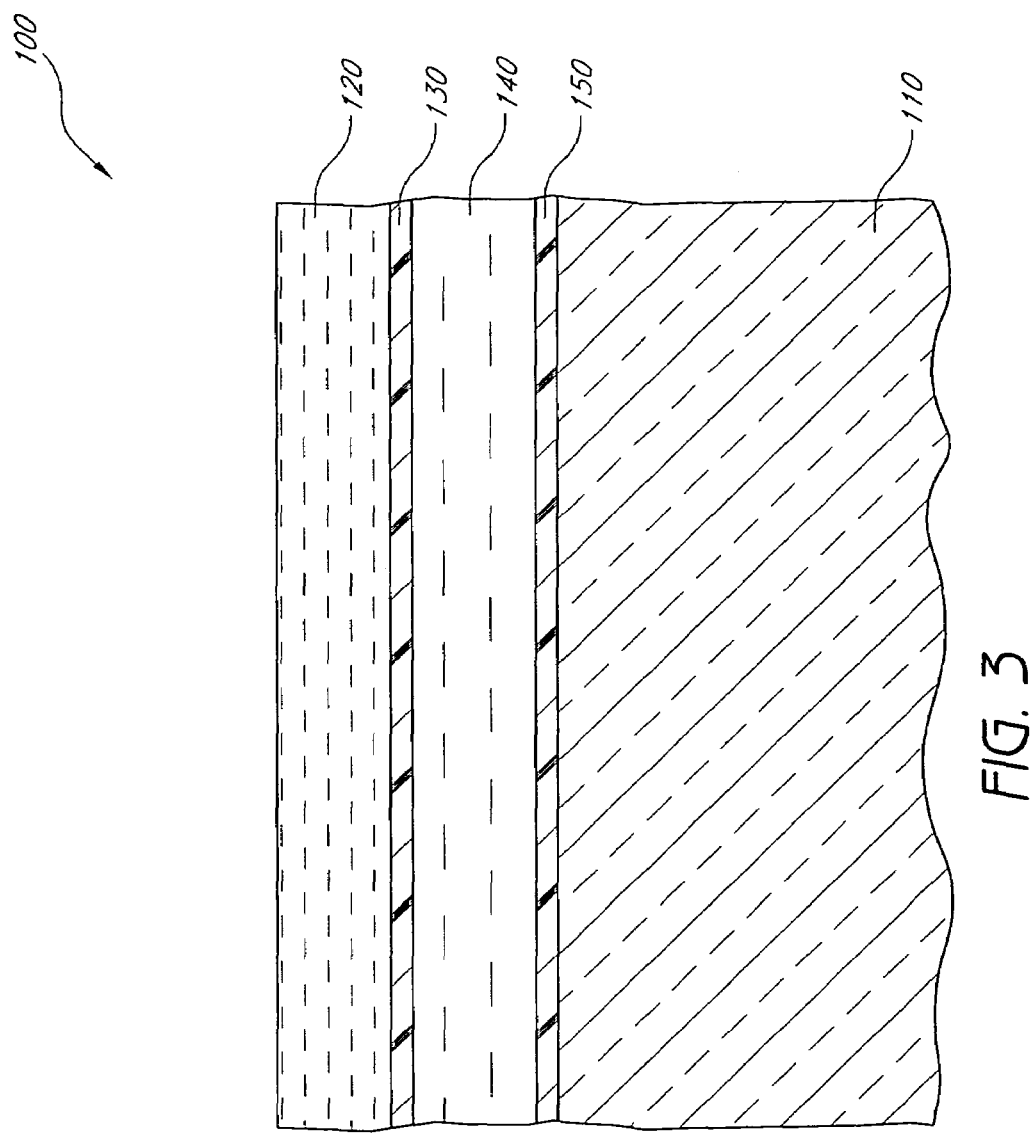
FIG. 3 is a schematic cross-sectional side view of a partially formed integrated circuit, in accordance with preferred embodiments of the invention.

FIG. 3 shows a cross-sectional side view of a partially formed integrated circuit 100. While the preferred embodiments can be used to form any integrated circuit, they are particularly advantageously applied to form devices having arrays of electrical devices, including memory cell arrays for volatile and non-volatile memory devices such as DRAM, ROM or flash memory, including NAND flash memory. Consequently, the integrated circuit 100 can preferably be a memory chip or a logic or processor with embedded memory or a gate array.

With continued reference to FIG. 3, various masking layers 120-150 are preferably provided above a substrate 110. The layers 120-150 will be etched to form a mask for patterning the substrate 110, as discussed below. The materials for the layers 120-150 overlying the substrate 110 are preferably chosen based upon consideration of the chemistry and process conditions for the various pattern forming and pattern transferring steps discussed herein. Because the layers between a topmost selectively definable layer 120 and the substrate 110 preferably function to transfer a pattern derived from the selectively definable layer 120 to the substrate 110, the layers 130-150 between the selectively definable layer 120 and the substrate 110 are preferably chosen so that they can be selectively etched relative to other exposed materials. It will be appreciated that a material is considered selectively, or preferentially, etched when the etch rate for that material is at least about 5 times greater, preferably at least about 10 times greater, more preferably at least about 20 times greater and, most preferably, at least about 40 times greater than that for surrounding materials. Because a goal of the layers 120-150 overlying the substrate 110 is to allow well-defined patterns to be formed in that substrate 110, it will be appreciated that one or more of the layers 120-150 can be omitted or substituted if suitable other materials, chemistries and/or process conditions are used. For example, the layer 130 can be omitted in some embodiments where the resolution enhancement properties of that layer, as discussed below, are not desired. In other embodiments, discussed further below, additional masking layers can be added between the layer 150 and the substrate 110 to form a mask having improved etch selectivity relative to the substrate 110. Exemplary materials for the various layers discussed herein include silicon oxide, silicon nitride, silicon, amorphous carbon, dielectric antireflective coatings (DARC, silicon rich silicon oxynitride), and organic bottom antireflective coatings (BARC), each of which can be selectively etched relative to at least 2 or 3 of the other materials, depending upon the application.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Preferably, the upper layer is thick enough so that it is not worn away over the course of the pattern transfer.

The selectively definable layer 120 overlies a first hard mask, or etch stop, layer 130, which overlies a temporary layer 140, which overlies a second hard mask, or etch stop, layer 150, which overlies the substrate 110 to be processed (e.g., etched) through a mask. The selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm systems) or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the first hard mask layer 130 is a dielectric anti-reflective coating (DARC). Using DARCs for the first hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

The temporary layer 140 is preferably formed of amorphous carbon, which, as noted above, offers very high etch selectivity relative to the preferred hard mask materials. More preferably, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference.

The material for the second hard mask layer 150 is preferably chosen based upon the material used for the spacers and for the underlying substrate 110. Where the spacer material is an oxide, the second hard mask layer 150 preferably comprises a dielectric anti-reflective coating (DARC) (e.g., a silicon oxynitride), silicon or aluminum oxide ($Al_2O_3$). In addition, a bottom anti-reflective coating (BARC) (not shown) can optionally be used to control light reflections. In the illustrated embodiment, the second hard mask layer 150 comprises aluminum oxide.

The various layers discussed herein can be formed by various methods known in the art. For example, spin-on-coating processes can be used to form photodefinable layers, BARC, and spin-on dielectric oxide layers. Various vapor deposition processes, such as chemical vapor deposition, can be used to form hard mask layers.

Having formed a desired stack of layers, a pattern of spacers is next formed by pitch multiplication.

Figure 4:
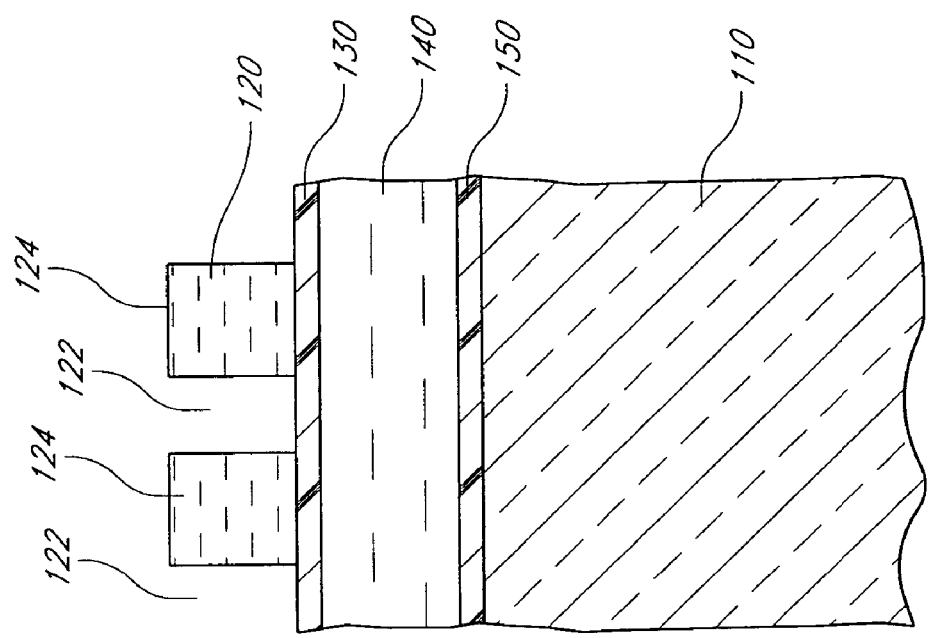
FIG. 4 is a schematic cross-sectional side view of the partially formed integrated circuit of FIG. 3 after forming lines in a photoresist layer, in accordance with preferred embodiments of the invention.

With reference to FIG. 4, a pattern comprising spaces or trenches 122, which are delimited by photodefinable material features 124, is formed in the photodefinable layer 120. The trenches 122 can be formed by, e.g., photolithography with 248 nm or 193 nm light, in which the layer 120 is exposed to radiation through a reticle and then developed. After being developed, the remaining photodefined material forms mask features such as the illustrated lines 124 (shown in cross-section only).

Figure 5:
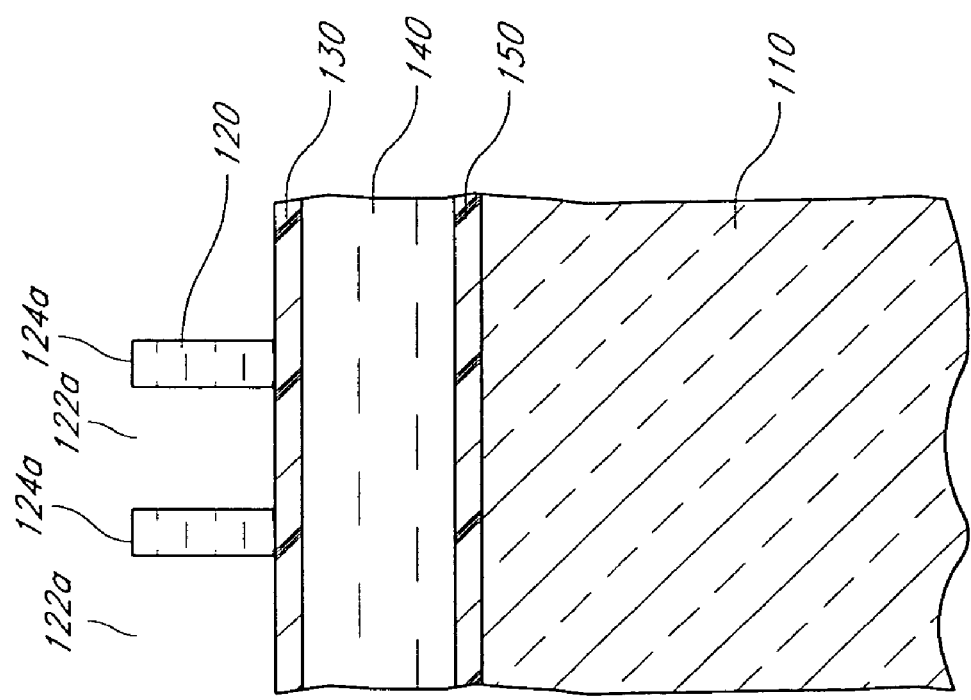
FIG. 5 is a schematic cross-sectional side view of the partially formed integrated circuit of FIGS. 4 after widening spaces between lines in the photoresist layer, in accordance with preferred embodiments of the invention.

As shown in FIG. 5, the photoresist lines 124 can be etched using an isotropic etch to "shrink" those features to adjust their widths. The extent of the etch is preferably selected so that the widths of the modified lines 124a are substantially equal to the desired spacing between the later-formed spacers 175 (FIG. 11), as will be appreciated from the discussion below. Suitable etches include etches using an oxygen-containing plasma, e.g., a $SO_2/O_2/N_2/Ar$ plasma, a $Cl_2/O_2/He$ plasma or a $HBr/O_2/N_2$ plasma. For example, the width of the lines 124 can be reduced from about 80-120 nm to about 40-70 nm. Advantageously, the width-reducing etch allows the lines 124a to be narrower than would otherwise be possible using the photolithographic technique used to pattern the photodefinable layer 120. In addition, the etch can smooth the edges of the lines 124a, thus improving the uniformity of those lines. While the critical dimensions of the lines 124a can be etched below the resolution limits of the photolithographic technique, it will be appreciated that this etch does not alter the pitch of the spaces 122a and lines 124a, since the distance between identical points in these features remains the same.

Figure 6:
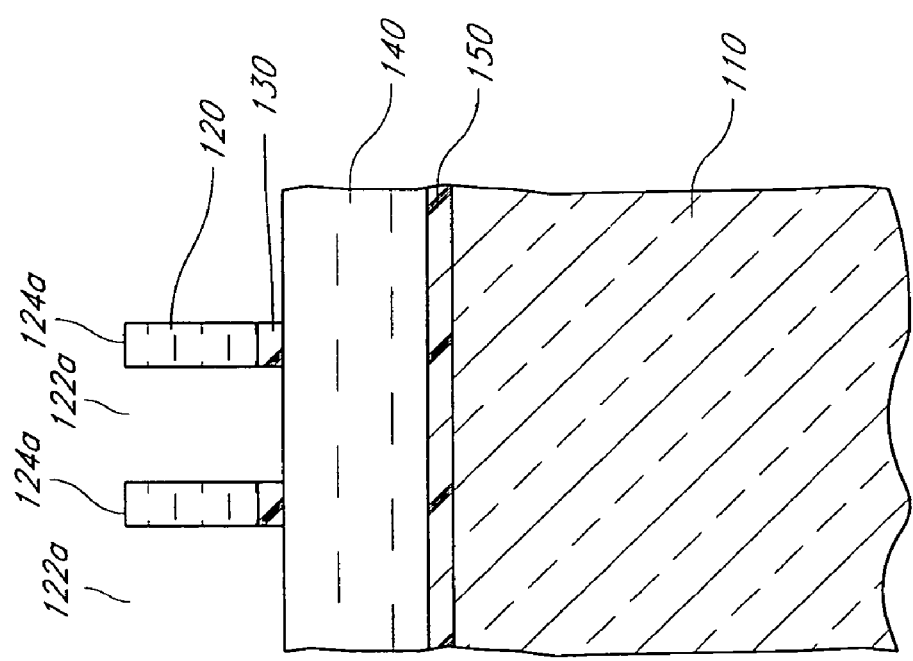
FIG. 6 is a schematic cross-sectional side view of the partially formed integrated circuit of FIG. 5 after etching through a hard mask layer, in accordance with preferred embodiments of the invention.

With reference to FIG. 6, the pattern in the (modified) photodefinable layer 120a is transferred to the hard mask layer 130. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CFH_3$, $CF_2H_2$ and $CF_3H$.

Figure 7:
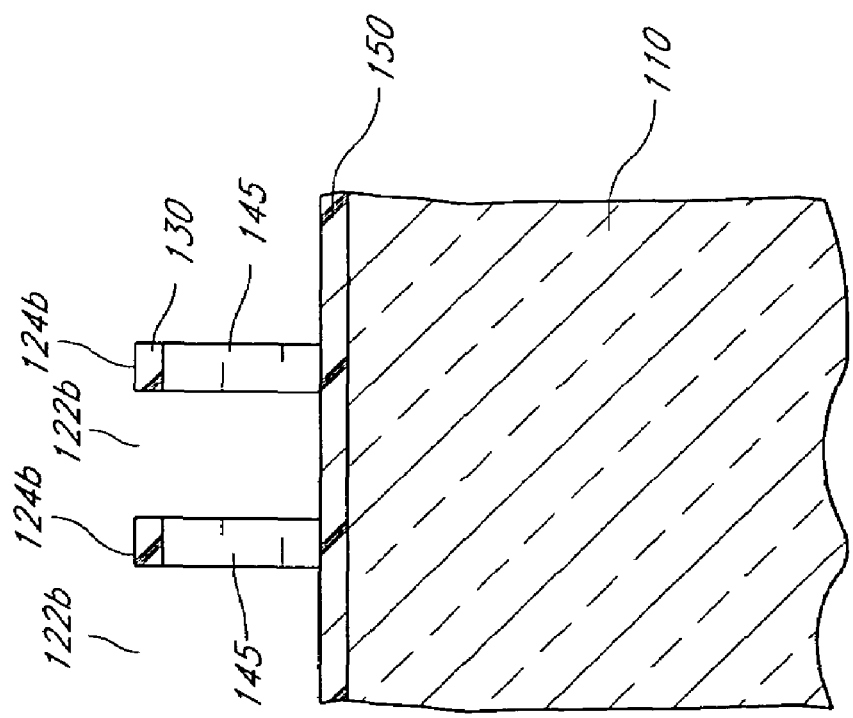
FIG. 7 is a schematic, cross-sectional side view of the partially formed integrated circuit of FIG. 6 after transferring a pattern from the hard mask layer to a temporary layer to form a pattern of mandrels in the temporary layer, on a first level, in accordance with preferred embodiments of the invention.

With reference to FIG. 7, the pattern in the photodefinable layer 120a and the hard mask layer 130 is transferred to the temporary layer 140 to form mandrels 145. Layers 170a and 170b of spacer material (FIGS. 9-10) will later be deposited on the mandrels 145. It has been found that the temperatures used for spacer material deposition (which is preferably conformal, such that processes such as chemical vapor deposition are preferred) are typically too high for photoresist to withstand. Thus, the pattern is preferably transferred from the photodefinable layer 120a to the temporary layer 140, which is formed of a material that can withstand the process conditions for spacer material deposition and etching, discussed below. In addition to having higher heat resistance than photoresist, the material forming the temporary layer 140 is preferably selected such that it can be selectively removed relative to the material for the spacers 175 (FIG. 11) and the underlying etch stop layer 150. As noted above, the layer 140 is preferably formed of amorphous carbon and, more preferably, transparent carbon.

The pattern in the modified photodefinable layer 120a is preferably transferred to the temporary layer 140 using a reactive ion etch (RIE) employing an oxygen-containing plasma, e.g., a plasma containing $SO_2$, $O_2$ and Ar. Other suitable etch chemistries include a $Cl_2/O_2/SiCl_4$, $SiCl_4/O_2/N_2$, or $HBr/O_2/N_2/SiCl_4$-containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, the entire disclosure of which is incorporate herein by reference. It will be appreciated that the $SO_2$-containing plasma can simultaneously etch the temporary layer 140 and also remove the photoresist layer 120a. The resulting lines 124b, separated by spaces 122b, constitute the placeholders or mandrels along which a pattern of spacers 175 (FIG. 11) will be formed.

Figure 8:
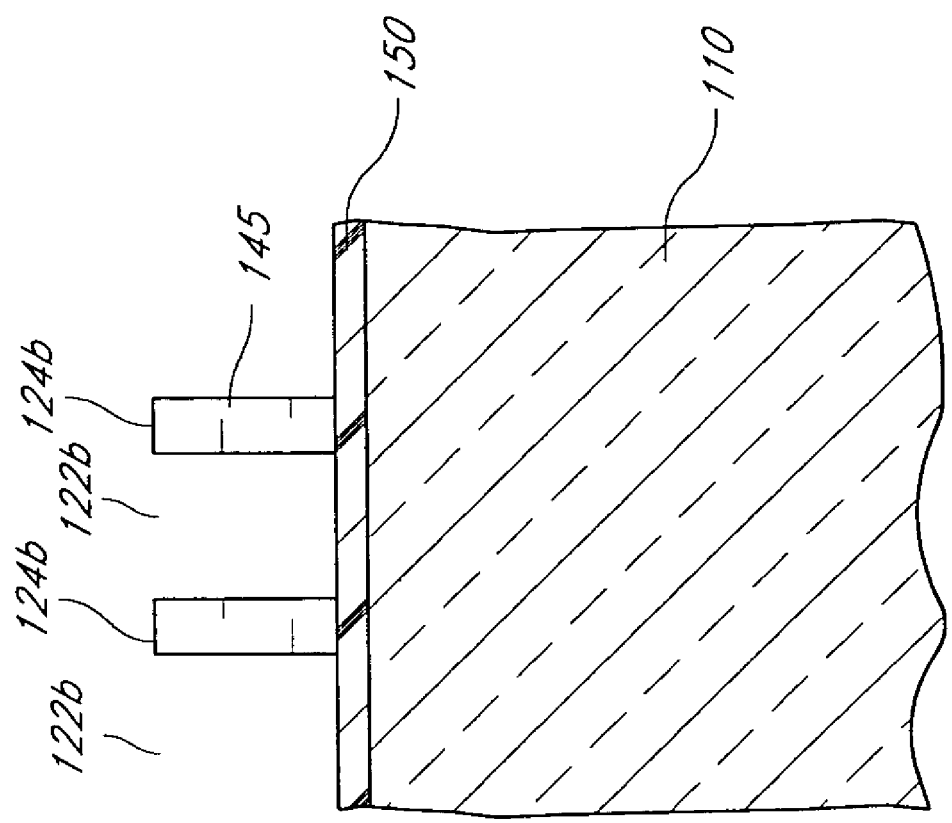
FIG. 8 is a schematic, cross-sectional side view of the partially formed integrated circuit of FIG. 7 after a hard mask layer removal, in accordance with preferred embodiments of the invention.
Figure 12:
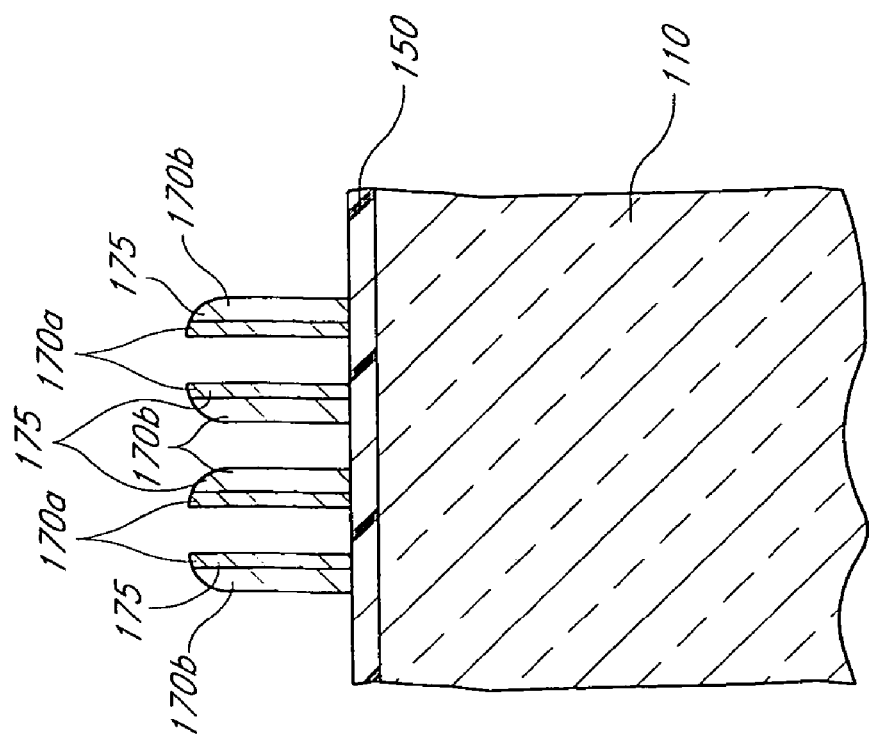
FIG. 12 is a schematic, cross-sectional side view of the partially formed integrated circuit of FIG. 11 after selectively removing mandrels, in accordance with preferred embodiments of the invention.

With reference to FIG. 8, the hard mask layer 130 can be selectively removed to facilitate later spacer formation by leaving the mandrels 145 exposed for subsequent etching (FIG. 12). The hard mask layer 130 can be removed using a buffered oxide etch (BOE), which is a wet etch comprising HF and $NH_4F$.

Figure 9:
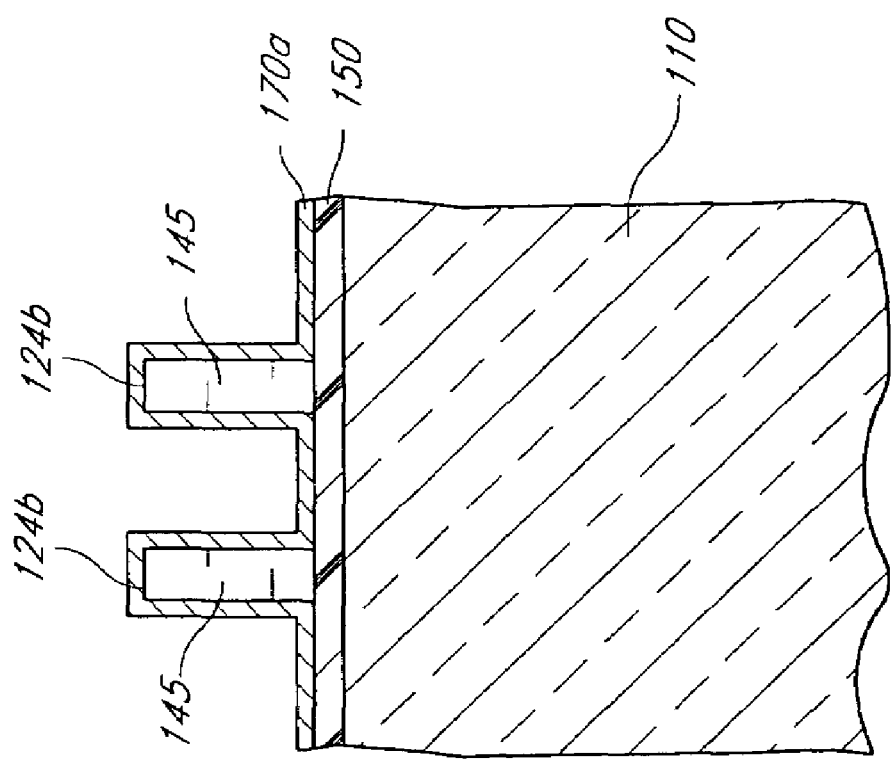
FIG. 9 is a schematic, cross-sectional side view of the partially formed integrated circuit of FIG. 8 after depositing a first layer of a spacer material, in accordance with preferred embodiments of the invention.

Next, as shown in FIG. 9, a reaction barrier layer 170a is blanket deposited over exposed surfaces, including the hard mask layer 150 and the tops and sidewalls of the mandrels 145. The material forming the layer 170a is preferably similar to the material used for the spacers, e.g., both materials can be forms of silicon oxide, or the layer 170a can be formed of a material for which an etch selectivity similar to that of the spacer material is available. The deposition process conditions and/or reactants, however, are chosen such that the deposition process results in minimal deformation of the mandrels. In addition, the layer 170a preferably has a composition and thickness that minimizes diffusion of reactants in a subsequent deposition through the layer 170a on to the mandrels 145. The layer 170a is preferably a layer of a first spacer material which can be deposited using a first deposition process using a first set of precursors having minimal reactivity with the mandrels.

It will be appreciated that the first spacer material can be any material that can act as a mask for transferring a pattern to the underlying hard mask layer 150. The spacer material preferably: 1) can be deposited with good step coverage; 2) can be deposited at a temperature compatible with the mandrels 145; and 3) can be selectively etched relative to the mandrels 145 and underlying hard mask layer 150. Preferred materials include silicon, silicon oxides and silicon nitrides. In the illustrated embodiment, the first spacer material is silicon oxide, which provides particular advantages in combination with other selected materials of the masking stack.

As noted above, the silicon oxide is preferably deposited by a plasma enhanced chemical vapor deposition using oxygen gas ($O_2$) and TEOS as precursors. The reactants in this process advantageously have a low reactivity with mandrel materials, such as amorphous carbon, in comparison to other oxygen precursors such as $O_3$.

An example of a suitable reactor system is the Applied Materials' Producer™ system, which can remotely generate excited reactive species, such as an oxygen plasma. In one example of process conditions, $O_2$ is preferably remotely activated and flowed into the reactor at a rate of about 300-1000 sccm and, more preferably, about 400-600 sccm. TEOS is flowed into the reactor at a rate of about 200-800 mgm and, more preferably, about 400-600 mgm and a carrier gas, e.g., He, is flowed flowed into the reactor at a rate of about 2000-3000 sccm and, more preferably, about 2500 sccm. The RF power is preferably about 300-800 watts and, more preferably, about 500-600 watts. The pressure within the reactor is preferably maintained at about 5-10 torr and, more preferably, about 6-8 torr.

The reactor is preferably maintained at a temperature sufficiently low to prevent chemical or physical disruption of the amorphous carbon layer. In addition, it has been found that material deposited on amorphous carbon mandrels can peel off at high deposition temperatures. Consequently, the deposition temperature is preferably about 350-400° C. and, more preferably, about 375° C.

The layer of the first spacer material 170a is preferably deposited to a thickness of about 100-300 Å and, more preferably, about 150-250 Å. This thickness has been found to adequately protect the mandrels 145 from reactions with subsequent reactants, such $O_3$ which can oxidize the mandrels 145. In addition, because films deposited by the PEVCD process may not be as conformal as films deposited by thermal CVD processes, this relatively thin layer 170a minimizes the affect of uniformities of the PECVD process on the ultimately deposited spacer layer 170 (FIG. 10B).

It will be appreciated that the conformality of a layer is related to its step coverage. A highly conformal layer has high step coverage. Preferably, the step coverage (the ratio of the thickness of the deposited layer at a midpoint up the height of the mandrel relative to the thickness of the deposited layer at a top of the mandrel in percentage terms) is about 50% or greater, more preferably, about 75% or greater and, most preferably, about 95% or greater.

Figure 10A:
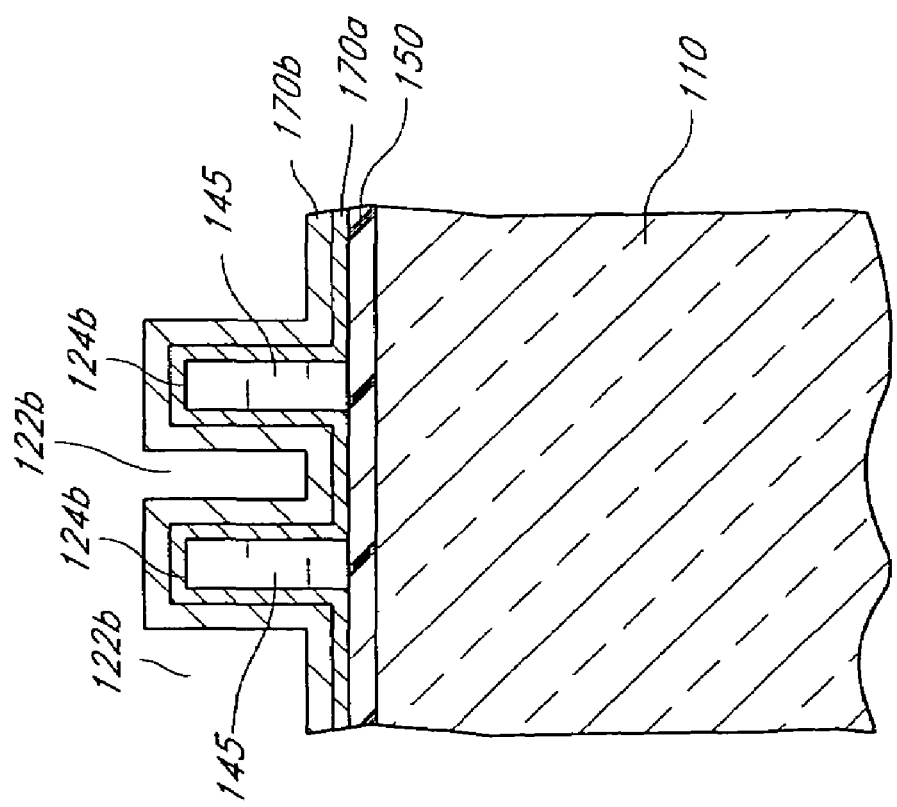
FIG. 10A is a schematic, cross-sectional side view of the partially formed integrated circuit of FIG. 9 after depositing a second layer of the spacer material onto the first layer, in accordance with preferred embodiments of the invention.
Figure 10B:
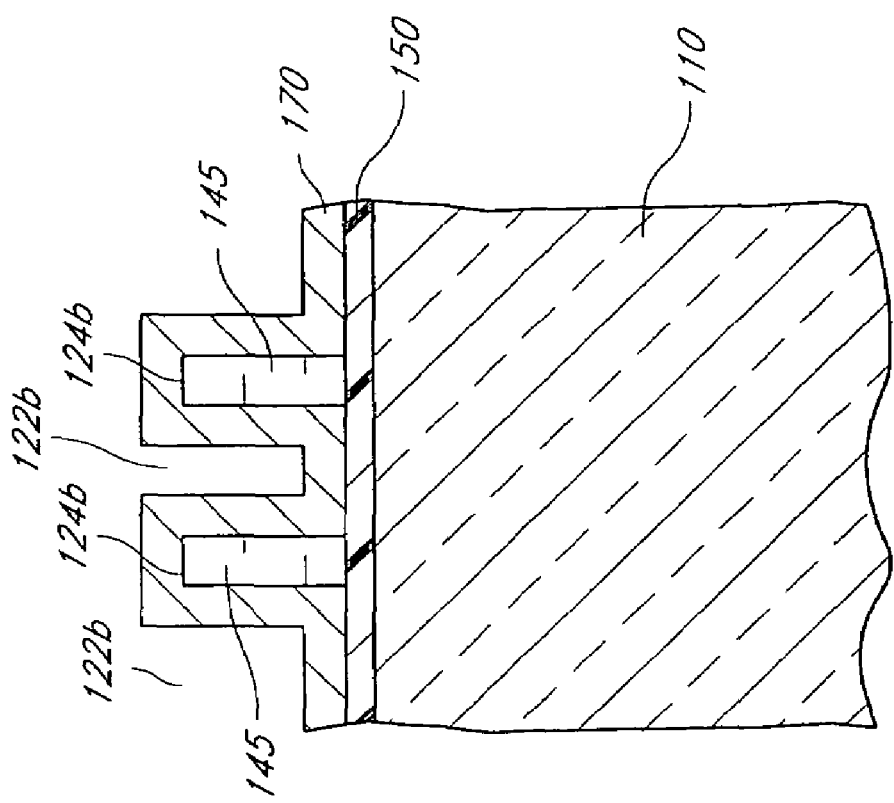
FIG. 10B is another schematic, cross-sectional side view of the partially formed integrated circuit of FIG. 10A, in accordance with preferred embodiments of the invention.

With reference to FIG. 10A, a layer of the second spacer material 170b is deposited on the layer of the first spacer material 170a. The second layer 170b is preferably deposited by a process which can deposit a highly conformal film. In addition, as above, the deposition temperature is preferably sufficiently low to prevent chemical or physical disruption of the amorphous carbon layer. Preferably, the second layer 170b is deposited by a thermal chemical vapor deposition using ozone ($O_3$) and TEOS as precursors at a deposition temperature of about 350-450° C. and, more preferably, about 375° C. Preferably, the step coverage of the layer 170b is about 75% or greater, more preferably, about 85% or greater and, most preferably, about 95% or greater.

Depending on the capabilities of the reactor, the same reactor used for depositing the layer 170a may also be used for this thermal CVD. For example, the Applied Materials' Producer™ system can be used for both this thermal CVD and the above-described PECVD. In one example of process conditions for the thermal CVD, the flow rate of $O_3$ into the reactor is about 4000-10000 sccm and, more preferably, about 6000 sccm. The flow rate of TEOS into the reactor is about 2000-3000 mgm and, more preferably, about 2400 mgm and a carrier gas, e.g., He or $N_2$, is flowed flowed into the reactor at a rate of about 4000-10000 sccm and, more preferably, about 6000 sccm. The reaction chamber pressure is preferably maintained at about 40-400 torr and, more preferably, about 100 torr.

With continued reference to FIG. 10A, it will be appreciated that where the first and second layers 170a and 170b are both formed of a similar spacer material, the layers 170a and 170b are shown as separate layers for ease of explanation and illustration. Where these layers 170a and 170b are formed of the same material, however, they may be viewed as forming a single layer 170 of spacer material, as illustrated in FIG. 10B.

While generally being considered to be the "same" material, e.g., silicon oxide, the skilled artisan will appreciate that the different deposition processes used to form the layers 170a and 170b can cause small structural and chemical variations in those layers. For example, the layer 170a, when formed with $O_2$ and TEOS in a PECVD, can have a higher density than the layer 170b, when formed with $O_3$ and TEOS in a thermal CVD. In addition, the use of these different reactants can result in slightly different ratios of oxygen to silicon, and also the possible presence of different impurities, in the deposited layers 170a and 170b. Given these differences between the layers 170a and 170b, it will be appreciated that the layers can have slightly different properties. For example, the rate that the layers are etched by a given etchant can be slightly different. In addition, the ability of the layers to act as diffusion barriers can be different, e.g., the layer 170a can be a better diffusion barrier than the layer 170b, which may be more porous than the layer 170a.

Figure 11:
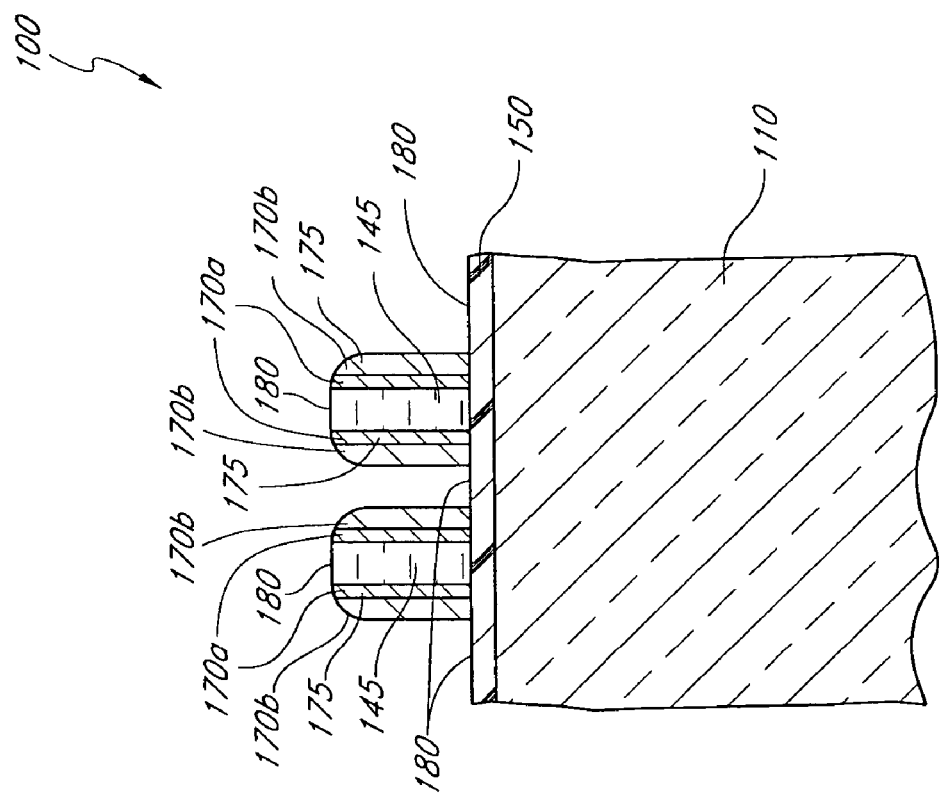
FIG. 11 is a schematic, cross-sectional side view of the partially formed integrated circuit of FIGS. 10A and 10B, in accordance with preferred embodiments of the invention.

It will be appreciated that the combined thickness of the layers 170a and 170b correspond approximately to the width of the spacers 175 (FIG. 11). Thus, the thickness of the layer 170 is preferably determined based upon the desired width of the spacers 175. As a result, after preferably depositing the first layer 170a to a thickness sufficiently thick to act as a reaction barrier, the layer 170b is preferably formed so that the aggregate thickness of the layers 170a and 170b is about the desired width of the spacers 175.

With reference to FIG. 11, the spacer layer 170a and 170b are then subjected to an anisotropic etch to remove spacer material from horizontal surfaces 180 of the partially formed integrated circuit 100. Such a directional etch, also known as a spacer etch, can be performed using a fluorocarbon plasma, e.g., a $CF_4/CHF_3$, $C_4F_8/CH_2F_2$ or $CHF_3/Ar$ plasma. It will be appreciated that while shown for ease of illustration having approximately the same width as the mandrels 145, the spacers 175 can have a smaller width than the mandrels 145.

With reference to FIG. 12, a pattern of free standing spacers 175 is formed by removing the mandrels 145. The mandrels 145 are selectively removed using an organic strip process. Preferred etch chemistries include a sulfur-containing plasma etch, such as an etch using $SO_2$.

Thus, a pitch multiplied pattern of spacers 175 have been formed. In the illustrated embodiment, the pitch of the spacers 175 is roughly half that of the photoresist lines 124 and spaces 122 (FIG. 4) originally formed by photolithography. Where the photoresist lines 124 had a pitch of about 200 nm, spacers 175 having a pitch of about 100 nm or less can be formed.

Figure 13:
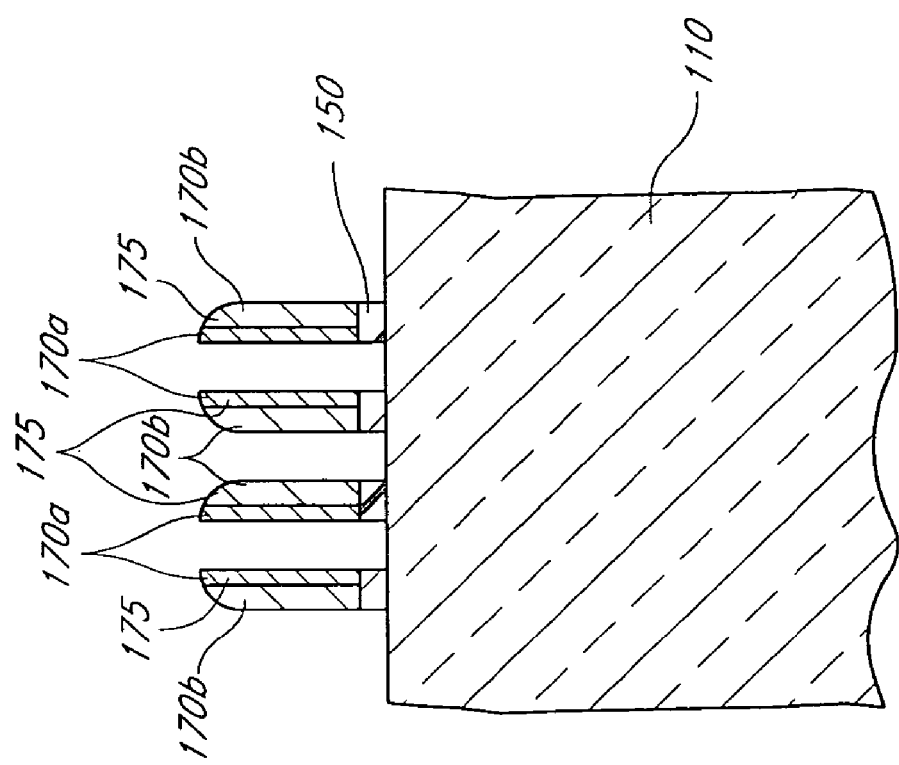
FIG. 13 is a schematic, cross-sectional side view of the partially formed integrated circuit of FIG. 12 after transferring a pattern formed by the spacers to a hard mask layer underlying the spacers, in accordance with preferred embodiments of the invention.

In some embodiments, particularly where the substrate 110 can be etched with good selectivity relative to the hard mask layer 150, the hard mask layer 150 can be used as a mask to etch the substrate 110. As shown in FIG. 13, the pattern formed by the spacers 175 can be transferred to the hard mask layer 150 using an anisotropic etch, e.g., a $BCl_3/Cl_2$ plasma etch, to selectively etch the layer 150 through that pattern formed by the spacers 175.

Optionally, the spacers 175 can be removed to reduce the aspect ratio of mask features before etching the substrate 110. For example, where the spacers 175 comprise a silicon oxide, the spacer removal can be accomplished using a wet or dry etch, e.g., a wet buffered oxide etch or a dry etch using a $CH_2F_2/C_4F_8/Ar/O_2$ plasma.

Figure 14:
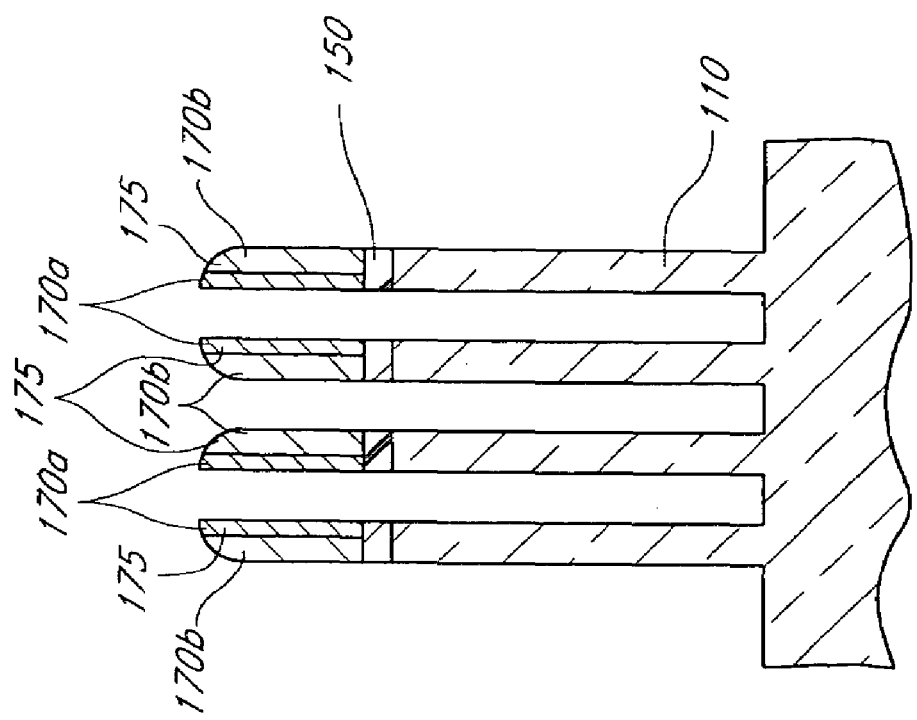
FIG. 14 is a schematic, cross-sectional side view of the partially formed integrated circuit of FIG. 13 after transferring the spacer pattern to an underlying substrate, in accordance with preferred embodiments of the invention.

With reference to FIG. 14, the hard mask layer 150 and/or the spacers 175 can be used as a mask through which the substrate 110 is processed. For example, the pattern in the hard mask 150 can be transferred to the substrate 110 by selectively etching the substrate 110, using an etch chemistry appropriate for the material(s) of the substrate 110, as known in the art.

Figure 15:
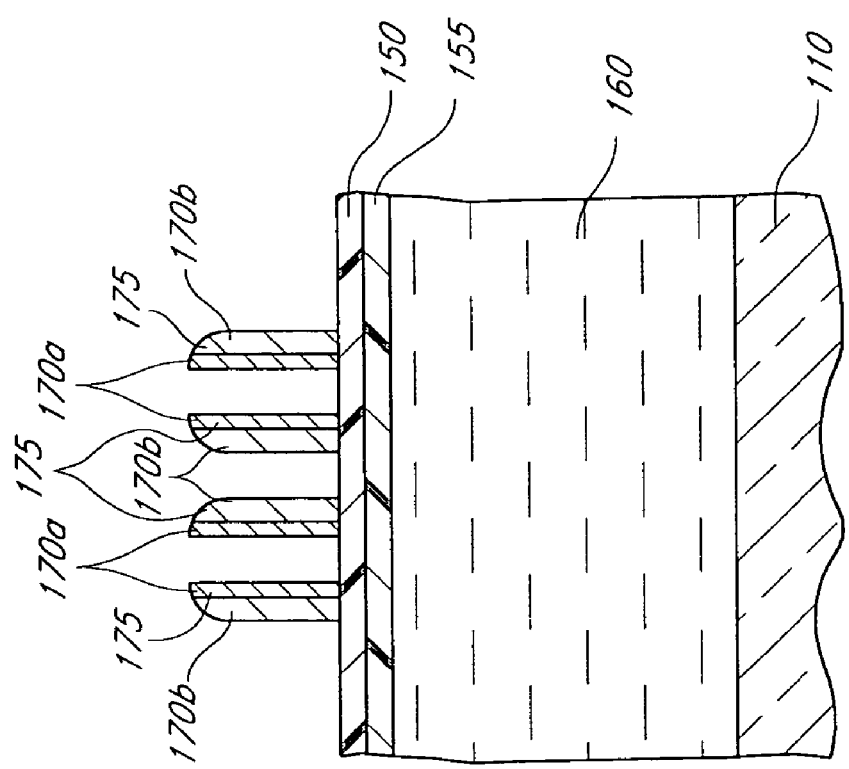
FIG. 15 is a schematic, cross-sectional side view of a partially formed integrated circuit having hard mask and additional masking layers disposed between spacers and the substrate, in accordance with preferred embodiments of the invention.

With reference to FIG. 15, in other embodiments, especially where the substrate 110 is difficult to etch, intervening layers of masking material can be formed between the hard mask layer 150 and the substrate 110. For example, additional layers 155 and 160 can be provided, as discussed in co-pending U.S. Patent Provisional Application No. 60/662,323 to Tran et al., filed Mar. 15, 2005, entitled Pitch Reduced Patterns Relative to Photolithography Features, the entire disclosure of which is incorporated herein by reference.

Figure 16:
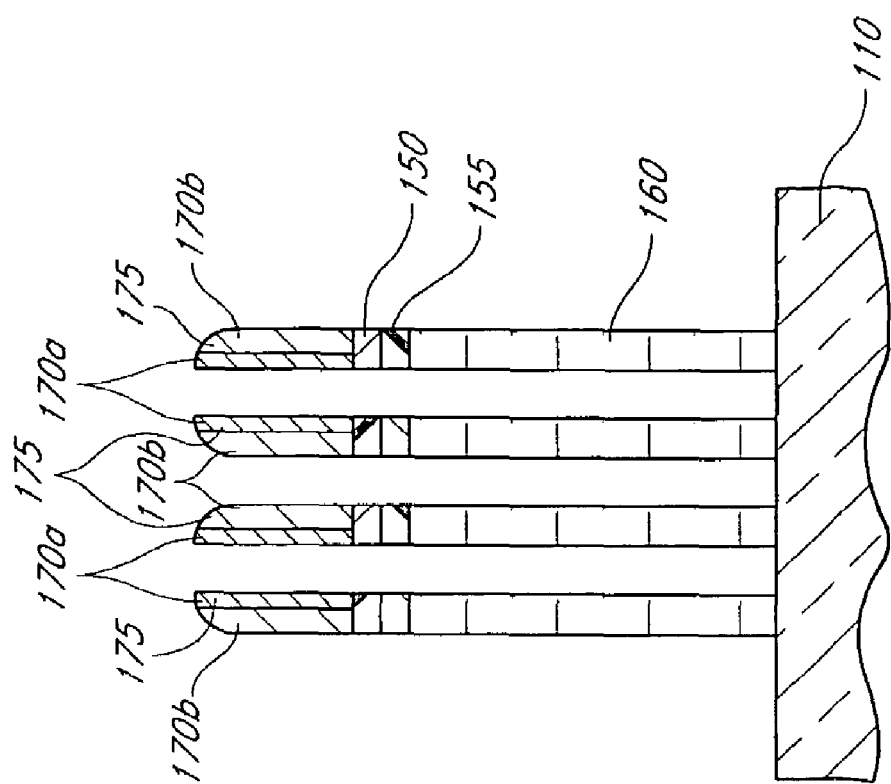
FIG. 16 is a schematic, cross-sectional side view of the partially formed integrated circuit of FIG. 15 after transferring the spacer pattern into the additional masking layer, in accordance with preferred embodiments of the invention.

In such a case, the layer 150 preferably comprises a material that has good etch selectively relative to the spacers 175 and the layer 155. Exemplary materials for the layers 150 and 155 include amorphous silicon and silicon oxide, respectively. The layer 155 advantageously allows for a pattern-cleaning step (e.g., with $O_2$ plasma) to remove any polymerized organic residue that may be present as the result of previous etch processes, such as the removal of mandrels 145. After the cleaning step, a well-defined pattern can be transferred to the layer 160. The layer 160 is preferably formed of amorphous carbon, which is advantageously resistant to many etch chemistries for removing silicon materials in the substrate 110. As shown in FIG. 16, the pattern defined by the spacers 175 can be transferred to the layer 160, which then serves as the primary mask for patterning the substrate 110. Advantageously, due to the availability of extreme selectivity when etching amorphous carbon, a patterned hard mask layer 150 can be used after removal of spacers to transfer the pattern with lower and more uniform aspect ratio features to the primary masking layer 160.

Figure 17:
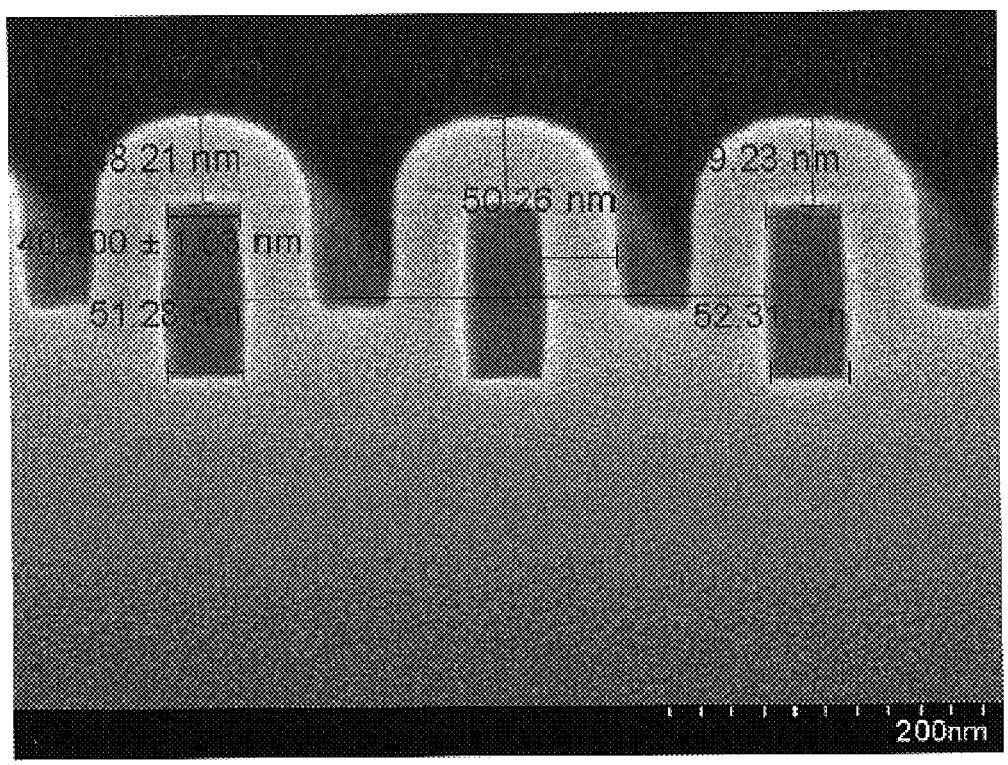
FIG. 17 is a micrograph, as viewed through a scanning electron microscope, of a side cross section of a mandrel with overlying spacer material formed in accordance with preferred embodiments of the invention.

It will be appreciated that the formation of spacers according to the preferred embodiments offers numerous advantages. By minimizing reactions of mandrels with precursors for spacers, deformation of the mandrels can also be minimized. A silicon oxide spacer layer formed by a PECVD with $O_2$ and TEOS and then a thermal CVD with $O_3$ and TEOS is shown in FIG. 17. In comparison with the spacer layer shown in FIG. 2B, shrinkage and deformation of the mandrels is advantageously reduced. Thus, because the positions and sizes of the mandrels are not significantly altered by the spacer layer deposition, the spacers can be more reliably formed at their desired and expected positions.

Moreover, while PECVD using $O_2$ and TEOS can have a relatively low conformality that discourages its use in spacer formation, the spacer layer has excellent conformality, as can be seen in FIG. 17. The spacers formed from the spacer layer can better approximate their desired dimensions and positions. Thus, the preferred embodiments allow improved control of the dimensions of features in a mask pattern.

It will be appreciated that while discussed with reference to particular materials for the various layers and parts discussed herein, other materials can also be used. Preferably, however, any other materials that may be used offer the appropriate etch selectivity relative to the materials that are used, as discussed above. Moreover, while two layers 170a and 170b are illustrated, more than two layers, deposited by one or two or more different processes, can be deposited to form the spacer layer 170 (FIG. 10A). While preferably formed of the same material, these layers can be formed of different materials. For example, one layer can be formed of silicon oxide, while the other is formed of silicon nitride. In another example, one layer is formed of aluminum oxide and the other is formed of silicon oxide. Where the layers are formed of different materials, the materials are preferably chosen so that suitable etch chemistries are available to perform a complete spacer etch and subsequent transfer of the spacer pattern to underlying layers. Advantageously, the material for the first layer can be chosen to have benefits for direct contact and process exposure to the mandrels, while the material for the second layer can be chosen to have benefits for completing the spacer layer (e.g., increased deposition rates, conformality, etc.).

In addition to the CVD processes discussed above, various other processes can be used to deposit the various layers of material discussed herein. For example, atomic layer deposition (ALD) can be employed, for depositing one or both of the layers 170a and 170b, or additional layers to these layers. In some embodiments, ALD can be used to deposit a silicon oxide reaction barrier layer, using a self-limitingly deposited silicon precursor and an oxygen precursor, e.g., water, to form silicon oxide. Then, an $O_3$-based process, e.g., a thermal CVD with $O_3$ and TEOS, could be used to form the silicon oxide layer to a desired thickness.

In other embodiments, the same deposition processes (e.g., thermal CVD, ALD or PECVD) can be used, while the reactants are chosen based upon reactivity with mandrel materials. Where different processes are employed, the reactants used can be different for each process, or some reactants can be kept constant. For example, when forming silicon oxide, the silicon reactants can be varied for each process and the oxidizer can be the same or different for each process.

Also, the masks discussed herein can be used to form various integrated circuit features, including, without limitation, interconnect lines, landing pads and parts of various electrical devices, such as capacitors and transistors, particularly for memory and logic arrays in which dense repeating patterns are desirable. As such, while illustrated as lines with regular spacing and regular widths for ease of illustration, the masks can have features with variable spacing and variable dimensions. Optionally, the spacers can be trimmed and/or masked and etched to formed features with desired dimensions. Moreover, the spacers 175 can be more than pitch doubled. An exemplary method for further pitch multiplication is discussed in U.S. Pat. No. 5,328,810 to Lowrey et al. with reference to FIGS. 19-23 of that patent. Also, while illustrated with spacers formed on a single level, in other embodiments, spacers can be formed on multiple vertical levels and consolidated on a single level to form a mask pattern.

It will also be appreciated that the substrate 110 can comprise different materials, e.g., layers of different materials, or different materials in different lateral regions of the substrate. In such cases, the primary masking layer 160 is preferably used for superior etch selectivity. To transfer the pattern defined by the spacers to such a substrate, a succession of different chemistries, preferably dry-etch chemistries, can be used to successively etch through these different materials, if a single chemistry is not sufficient to etch all the different materials. It will also be appreciated that, depending upon the chemistry or chemistries used, the spacers 175 and the hard mask layer 150 may be etched. Using amorphous carbon for the primary mask layer 160, however, advantageously offers excellent resistance to conventional etch chemistries, especially those used for etching silicon-containing materials. Thus, the primary mask layer 160 can effectively be used as a mask for etching through a plurality of substrate layers, or for forming high aspect ratio trenches.

The preferred embodiments can also be employed multiple times throughout an integrated circuit fabrication process to form features in a plurality vertical levels, which may be vertically contiguous or non-contiguous and vertically separated. In such cases, each of the individual levels to be patterned would constitute a substrate 110. In addition, some of the preferred embodiments can be combined with other of the preferred embodiments, or with other masking methods known in the art, to form features on different areas of the same substrate 110 or on different vertical levels.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

We claim:

1. A process for semiconductor processing, comprising:
providing a plurality of vertically-extending and laterally-spaced apart mandrels over a substrate in a reaction chamber;
depositing a first layer of spacer material on sidewalls of the mandrels using a first set of reactive species;
subsequently depositing a second layer of the spacer material over the mandrels using a second set of reactive species; and
etching the first and second layers of the spacer material to form spacers immediately adjacent sidewalls of the mandrels.

2. The process of claim 1, wherein the first layer is a diffusion barrier that restricts diffusion of the second set of reactive species to the mandrels.

3. The process of claim 2, wherein the second layer is more porous to chemical species than the first layer.

4. The process of claim 1, wherein the spacer material in the first and second layers is silicon oxide.

5. The process of claim 1, wherein the mandrels are formed of amorphous carbon.

6. The process of claim 1, wherein the first set of reactive species comprises an excited species.

7. The process of claim 6, wherein the excited species is a remotely generated plasma.

8. The process of claim 6, wherein depositing the spacer material on the mandrels using the first set of reactive species comprises performing a plasma enhanced chemical vapor deposition with oxygen and tetraethylorthosilicate.

9. The process of claim 8, wherein the excited species is a tetraethylorthosilicate plasma.

10. The process of claim 6, wherein the second set of reactive species are non-radical reactants.

11. The process of claim 10, wherein depositing the spacer material over the mandrels using the second set of reactive species comprises performing a thermal chemical vapor deposition with ozone and tetraethylorthosilicate.

12. The process of claim 10, wherein the non-radical precursors comprise oxygen and tetraethylorthosilicate.

13. The process of claim 10, wherein the thermal chemical vapor deposition is performed at a reaction chamber temperature of about 350-450° C.

14. The process of claim 1, wherein providing a plurality of mandrels comprises:
photolithographically defining a pattern in a photoresist layer;
transferring the pattern into an amorphous carbon layer to form the plurality of mandrels.

15. The process of claim 1, wherein etching the spacer material comprises anisotrpically etching the spacer material to leave a plurality of vertically extending spacers.

16. A method for semiconductor processing, comprising:
defining a pattern in a photoresist layer over a substrate;
transferring the pattern from the photoresist layer to an underlying layer of temporary material, wherein transferring the pattern from the photoresist layer forms a plurality of temporary placeholders in the layer of temporary material;
depositing a first layer of spacer material on the plurality of features by a first deposition process;
depositing a second layer of spacer material on the first layer by a second deposition process;
preferentially removing spacer material of the first and second layers from horizontal surfaces to form a plurality of vertically extending silicon oxide features on sidewalls of the temporary placeholders, wherein the plurality of vertically extending silicon oxide features comprise spacer material of the first and second layers;
removing the temporary placeholders; and
processing the substrate through a mask pattern defined by the plurality of vertically extending silicon oxide features.

17. The method of claim 16, wherein the first process comprises a plasma enhanced deposition.

18. The method of claim 17, wherein the second process comprises a thermal chemical vapor deposition.

19. The method of claim 16, wherein the spacer material of the first and second layers is silicon oxide and wherein the temporary placeholders are formed of amorphous carbon.

20. The method of claim 16, wherein the plurality of vertically extending oxide features are spacers extending in spaced, generally parallel relation to one another at least between first and second spaced planes extending perpendicular to the spacers.

21. The method of claim 16, wherein defining the pattern in the photoresist layer comprises photolithographically defining features in the photoresist layer and isotropically etching the features.

22. The method of claim 21, wherein isotropically etching the features comprises performing an etch with an oxygen-containing plasma.

23. The method of claim 16, further comprising transferring a pattern comprising the plurality of vertically extending oxide features into a hard mask layer underlying the plurality of vertically extending oxide features.

24. The method of claim 23, wherein the hard mask layer directly overlies the substrate and wherein processing the substrate comprises etching the substrate through the hard mask layer.

25. The method of claim 23, further comprising:
transferring the pattern to an other hard mask layer underlying the hard mask layer; and
transferring the pattern to a primary masking layer underlying the other hard mask layer,
wherein processing the substrate comprises etching the substrate through the primary masking layer.

26. The method of claim 25, wherein the primary masking layer is formed of amorphous carbon.

27. The method of claim 16, wherein processing the substrate comprises etching through a plurality of different materials.

28. The method of claim 16, wherein processing the substrate defines features of a logic array.

29. The method of claim 16, wherein processing the substrate defines features of a gate array.

30. The method of claim 16, wherein processing the substrate defines features of a memory array.

31. The method of claim 16, wherein processing the substrate defines features of a computer processor.

32. A method for semiconductor processing, comprising:
providing a plurality of mandrels over a substrate;
forming a chemical reaction barrier on the mandrels;
forming a layer of spacer material on the chemical reaction barrier; and
preferentially removing the mandrels relative to the spacer material.

33. The method of claim 32, wherein forming the chemical reaction barrier comprises depositing the layer of barrier material on the mandrels by atomic layer deposition.

34. The method of claim 33, wherein the atomic layer deposition utilizes water as a reactant.

35. The method of claim 33, wherein forming the layer of spacer material comprises depositing the layer of spacer material on the layer of barrier material by chemical vapor deposition.

36. The method of claim 35, wherein the chemical vapor deposition utilizes $O_3$ as a reactant.

37. The method of claim 32, wherein forming the layer of spacer material comprises performing an atomic layer deposition.

38. The method of claim 37, wherein forming the layer of spacer material comprises utilizing a reactant different from reactants for forming the chemical reaction barrier.

39. The method of claim 32, wherein the barrier material and the spacer material are different materials.

40. The method of claim 39, wherein the barrier material and the spacer material are selected from the group consisting of oxide and silicon nitride.

41. The method of claim 39, wherein the barrier material and the spacer material are selected from the group consisting of aluminum oxide and silicon oxide.

42. The method of claim 32, wherein the barrier material and the spacer material is silicon oxide.

43. The method of claim 42, wherein forming the chemical reaction barrier comprises a plasma enhanced chemical vapor deposition with reactants comprising $O_2$ and TEOS.

44. The method of claim 43, wherein forming the layer of spacer material comprises a chemical vapor deposition with reactants comprising $O_3$ and TEOS.

45. The method of claim 32, wherein forming the chemical reaction barrier comprises depositing a layer of barrier material having a thickness of about 100-300 Å.

46. The method of claim 45, wherein the thickness of the layer of barrier material is about 150-250 Å.

47. The method of claim 32, further comprising etching the spacer material to form a plurality of horizontally extending spacers adjacent the mandrels.

48. The method of claim 47, further comprising removing the mandrels to form a pattern of free standing spacers.

49. The method of claim 48, further comprising transferring the pattern of free standing spacers to a first hard mask layer underlying the spacers.

50. The method of claim 49, further comprising transferring the pattern of free standing spacers to a second hard mask layer underlying the first hard mask layer.

51. The method of claim 50, further comprising transferring the pattern of free standing spacers to a masking layer underlying the second hard mask layer.

52. The method of claim 51, further comprising processing the substrate through the masking layer after transferring the pattern of free standing spacers to the masking layer.

53. The method of claim 52, wherein the masking layer comprises amorphous carbon.

54. The method of claim 52, wherein processing the substrate comprises etching the substrate.

55. The method of claim 54, wherein etching the substrate comprises employing a plurality of etch chemistries to etch a plurality of materials in the substrate.

* * * * *

UNITED STATES PATENT AND TRADEMARK OFFICE
CERTIFICATE OF CORRECTION

PATENT NO. : 7,390,746 B2  Page 1 of 1
APPLICATION NO. : 11/213486
DATED : June 24, 2008
INVENTOR(S) : Bai et al.

It is certified that error appears in the above-identified patent and that said Letters Patent is hereby corrected as shown below:

On the Title page, in field (56), under "Foreign Patent Documents", in column 2, line 1, delete "DE" and insert -- DD --, therefor.

In column 14, line 23, in Claim 15, delete "anisotrpically" and insert -- anisotropically --, therefor.

In column 14, line 35, in Claim 16, before "spacer" insert -- the --.

In column 14, line 37, in Claim 16, before "spacer" insert -- the --.

In column 14, line 42, in Claim 16, before "spacer" insert -- the --.

In column 15, line 30, in Claim 32, before "the mandrels;" insert -- sidewalls of --.

Signed and Sealed this

Second Day of September, 2008

JON W. DUDAS
*Director of the United States Patent and Trademark Office*